(12) United States Patent (10) Patent No.: US 7,903,866 B2
Van Der Wijst et al. (45) Date of Patent: Mar. 8, 2011

(54) MEASUREMENT SYSTEM, LITHOGRAPHIC APPARATUS AND METHOD FOR MEASURING A POSITION DEPENDENT SIGNAL OF A MOVABLE OBJECT

(75) Inventors: Marc Wilhelmus Maria Van Der Wijst, Veldhoven (NL); Engelbertus Antonius Fransiscus Van Der Pasch, Oirschot (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 998 days.

(21) Appl. No.: 11/730,190

(22) Filed: Mar. 29, 2007

(65) Prior Publication Data

US 2008/0240501 A1 Oct. 2, 2008

(51) Int. Cl.
*G06K 9/00* (2006.01)
(52) U.S. Cl. ......................................... 382/144; 382/151
(58) Field of Classification Search .......................... None
See application file for complete search history.

(56) References Cited

U.S. PATENT DOCUMENTS

| | | | |
|---|---|---|---|
| 5,610,715 A | 3/1997 | Yoshii et al. | |
| 6,208,407 B1 | 3/2001 | Loopstra | |
| 6,509,971 B2 | 1/2003 | Inoue et al. | |
| 6,674,510 B1 | 1/2004 | Jasper et al. | |
| 6,819,425 B2 | 11/2004 | Kwan | |
| 7,256,866 B2 | 8/2007 | Cox et al. | |
| 7,348,574 B2 | 3/2008 | Pril et al. | |
| 7,349,069 B2 | 3/2008 | Beems et al. | |
| 7,599,043 B2 | 10/2009 | Pril et al. | |
| 7,768,626 B2 | 8/2010 | Shibayama | |
| 7,817,243 B2 | 10/2010 | Heertjes et al. | |
| 7,817,248 B2 | 10/2010 | Kwan | |
| 2004/0263846 A1* | 12/2004 | Kwan | 356/399 |
| 2006/0192976 A1* | 8/2006 | Hall et al. | 356/505 |
| 2007/0035713 A1* | 2/2007 | Shibayama | 355/72 |

FOREIGN PATENT DOCUMENTS

| | | |
|---|---|---|
| EP | 1 760 529 A1 | 3/2007 |
| JP | 05-129184 A | 5/1993 |

(Continued)

OTHER PUBLICATIONS

Notification of Reasons for Refusal mailed Aug. 31, 2010 for Korean Patent Application No. 10-2008-0028949, 3 pgs.

(Continued)

*Primary Examiner* — Brian P Werner
(74) *Attorney, Agent, or Firm* — Sterne, Kessler, Goldstein & Fox P.L.L.C.

(57) ABSTRACT

An encoder-type measurement system is configured to measure a position dependent signal of a movable object, the measurement system including at least one sensor mountable on the movable object a sensor target object mountable on a substantially stationary frame, and a mounting device configured to mount the sensor target object on the substantially stationary frame. The measurement system further includes a compensation device configured to compensate movements and/or deformations of the sensor target object with respect to the substantially stationary frame. The compensation device may include a passive or an active damping device and/or a feedback position control system. In an alternative embodiment, the compensation device includes a gripping device which fixes the position of the sensor target object during a high accuracy movement of the movable object.

33 Claims, 3 Drawing Sheets

(I-I)

FOREIGN PATENT DOCUMENTS

| | | |
|---|---|---|
| JP | 05-335205 A | 12/1993 |
| JP | 07-270122 A | 10/1995 |
| JP | 10-092732 A | 4/1998 |
| JP | 11-008189 A | 1/1999 |
| JP | 11-045850 A | 2/1999 |
| JP | 2000-269118 A | 9/2000 |
| JP | 2000-323404 | 11/2000 |
| JP | 2001-135561 A | 5/2001 |
| JP | 2001-513267 A | 8/2001 |
| JP | 2002-151405 A | 5/2002 |
| JP | 2003-035509 A | 2/2003 |
| JP | 2005-512018 A | 4/2005 |
| JP | 2005-315426 A | 11/2005 |
| JP | 2006-114899 A | 4/2006 |
| JP | 2006-303505 A | 11/2006 |
| JP | 2006-344685 A | 12/2006 |
| JP | 2007-071874 A | 3/2007 |
| JP | 2008-543070 A | 11/2008 |
| KR | 2007-0026237 A | 3/2007 |
| WO | WO 02/079720 A1 | 10/2002 |

OTHER PUBLICATIONS

English language abstract for JP 05-129184 A, published May 25, 1993; 1 page.

English language abstract for JP 05-335205 A, published Dec. 17, 1993; 1 page.

English language abstract for JP 10-092732 A, published Apr. 10, 1998; 2 pages.

English language abstract for JP 11-008189 A, published Jan. 12, 1999; 2 pages.

English language abstract for JP 11-045850 A, published Feb. 16, 1999; 2 pages.

English language abstract for JP 2000-269118 A, published Sep. 29, 2000; 2 pages.

English language abstract for JP 2001-135561 A, published May 18, 2001; 2 pages.

English translation of Notice for Reasons for Rejection directed to related Japanese Patent Application No. JP 2008-072789, mailed on Nov. 25, 2010 from the Japan Patent Office; 5 pages.

\* cited by examiner

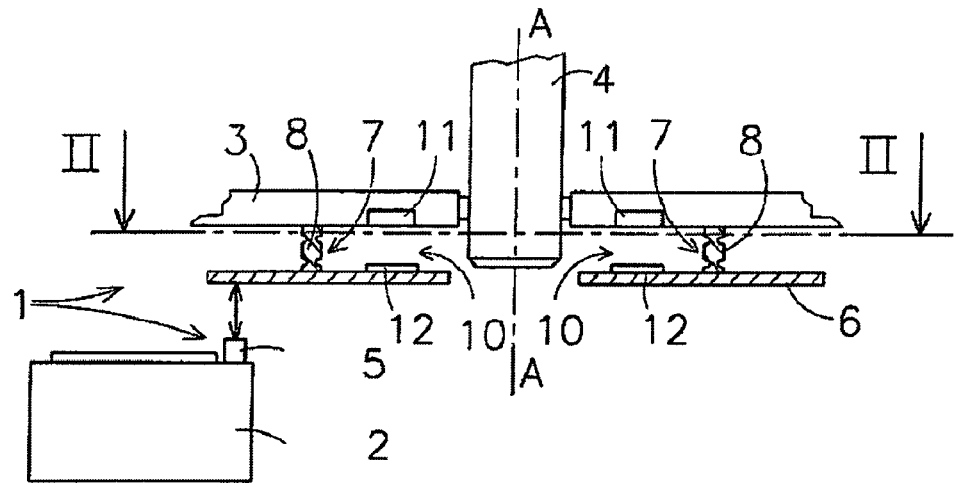
Figure 2 (I-I)
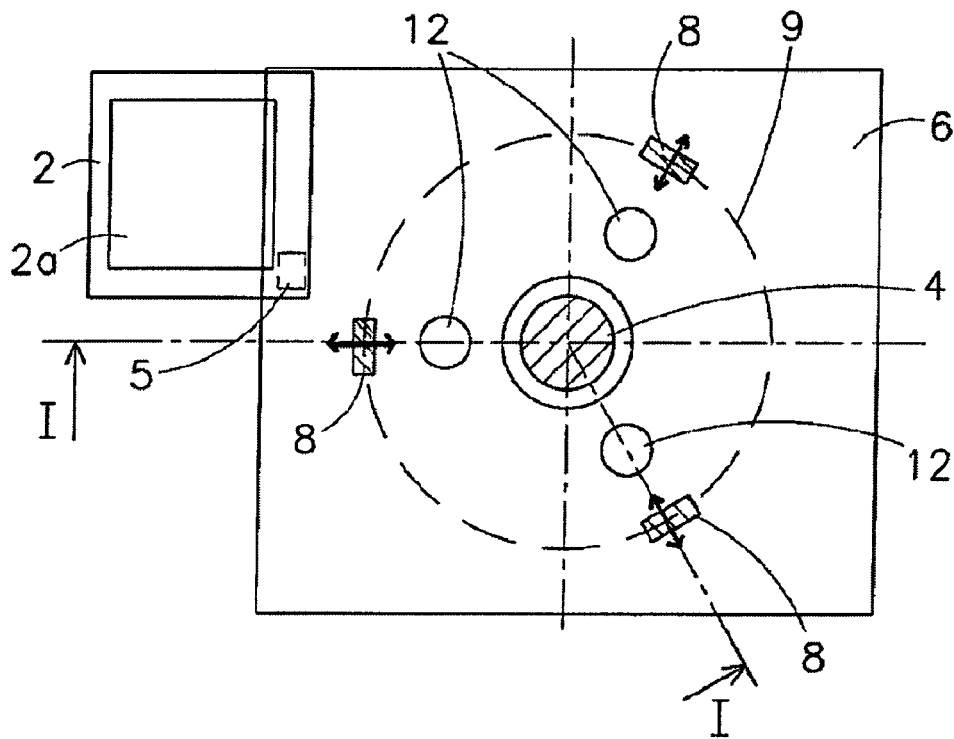
Figure 3 (II-II)

MEASUREMENT SYSTEM, LITHOGRAPHIC APPARATUS AND METHOD FOR MEASURING A POSITION DEPENDENT SIGNAL OF A MOVABLE OBJECT

BACKGROUND

1. Field

The present invention relates to a measurement system, a lithographic apparatus and a method for measuring a position dependent signal of a movable object.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus a measurement system is used for determining the position of a substrate stage with high accuracy (e.g. nanometer accuracy). Due to a continuing demand for higher throughput and increased accuracy, there is a need to improve the accuracy of measurement systems used in the lithographic apparatus, in particular for the measurement systems with which the position of the substrate stage and reticle stage are measured, and typically in six degrees of freedom.

In a known embodiment of the measurement system an encoder type measurement system is used. Such encoder-type measurement system may include one or more sensors mounted on the movable object and at least one sensor target object, for instance a sensor target plate including a grating or grid, the sensor target object mounted on a substantially stationary frame, in particular a so-called metrology frame (metro-frame). The sensor target object may include a one-dimensional multi dimensional grating. The sensor target object will be typically in the form of a plate on which a two dimensional orthogonal grid is arranged. Such sensor target object is often referred to as grid plate.

In alternative embodiments, the one or more sensors may be mounted on the substantially stationary frame and the grid plate or the grid plates may be mounted on the movable object. The grid plate includes a number grid lines or other grid markings which are used to determine a change in position of the grid plate with respect to the one or more sensors.

The known measurement system includes a mounting device for mounting the grid plate at a number of mounting points on the substantially stationary frame. Temperature changes and/or temperature differences in the metro frame may cause a change of shape of the metro-frame. Also, other influences may cause shape changes of the metro-frame. As a result, the distance between the mounting points of the mounting device of the grid plate may change and, as a consequence, the change in shape of the metro-frame may also result in a change of shape of the grid plate. Such deformations may have a negative influence on the measurement accuracy of the measurement system.

In order to compensate for such shape changes of the metro-frame, the mounting device includes a number of flexure elements which connect the grid plate to the metro-frame. These flexure elements are flexible in at least one degree of freedom in order to compensate the possible change in relative positions of the mounting points.

In a typical embodiment of an encoder-type measurement system for a substrate stage, a grid plate is mounted with three flexure elements which are arranged on the circumference of an imaginary circle drawn about the central axis of the lens column of the lithographic apparatus. The flexure elements allow movements of the metro-frame in radial direction with respect to the central axis of the lens column without transferring these movements to the grid plate. As the metro-frame is typically designed to deform circle-symmetrically about the central axis of the lens column, the grid plate will substantially remain in its position due to the flexure elements.

A drawback of the known measurement system is that since the mounting device of the grid plate, in particular the flexure elements, introduce some flexibility in the mounting of the grid plate, the grid plate may be moved or deformed by external influences. For instance, movements of the substrate stage may cause pressure waves which may cause movements or deformations in the grid plate. Such movements and/or deformations have a negative influence on the performance of the measurement system. In other measurement systems similar effects may occur and may have a negative influence on the accuracy of the measurement system.

SUMMARY

It is desirable to provide a high accuracy measurement system, preferably of the encoder-type, configured to measure a position dependent signal of a movable object, in which the accuracy of measurement is substantially less influenced by disturbances, in particular disturbances caused by movement of the movable object.

According to an embodiment of the invention, there is provided an encoder-type measurement system configured to measure a position dependent signal of a movable object, the measurement system including at least one sensor mountable on the movable object; a sensor target object including a grating or grid mountable on a substantially stationary frame, and a mounting device configured to mount the sensor target object on the substantially stationary frame, wherein the measurement system further includes a compensation device configured to at least partially compensate movements and/or deformations of the sensor target object with respect to the substantially stationary frame.

The position dependent signal may be, for example, a position, speed, or acceleration signal of the movable object.

According to an embodiment of the invention, there is provided a measurement system configured to measure a position dependent signal of a movable object with respect to a substantially stationary frame, the measurement system including at least one system part, and a mounting device configured to mount the system part on a substantially stationary frame, wherein the measurement system further includes a compensation device configured to at least partially compensate movements and/or deformations of the system part with respect to the substantially stationary frame.

According to an embodiment of the invention, there is provided lithographic apparatus including an illumination system configured to condition a radiation beam; a patterning device support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus includes a measurement system to measure a position dependent signal of the patterning device support or the substrate table with respect to a substantially stationary frame, the measurement system including at least one system part and a mounting device configured to mount the system part on the substantially stationary frame, wherein the measurement system further includes a compensation device configured to at least partially compensate movements and/or deformations of the system part with respect to the substantially stationary frame.

According to an embodiment of the invention, there is provided a method for measuring a position dependent signal of a movable object with respect to a substantially stationary frame using an encoder-type measurement system having a sensor mounted on the movable object and a sensor target object including a grating or grid mounted on the substantially stationary frame, the method including at least partially compensating movements and/or deformations of the grid plate with respect to the substantially stationary frame.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts schematically a side view of a measurement system according to an embodiment of the invention for measuring the position of a substrate stage in a lithographic apparatus; and FIG. 3 depicts schematically a top view of the embodiment of FIG. 2;

DETAILED DESCRIPTION

Figure 1:
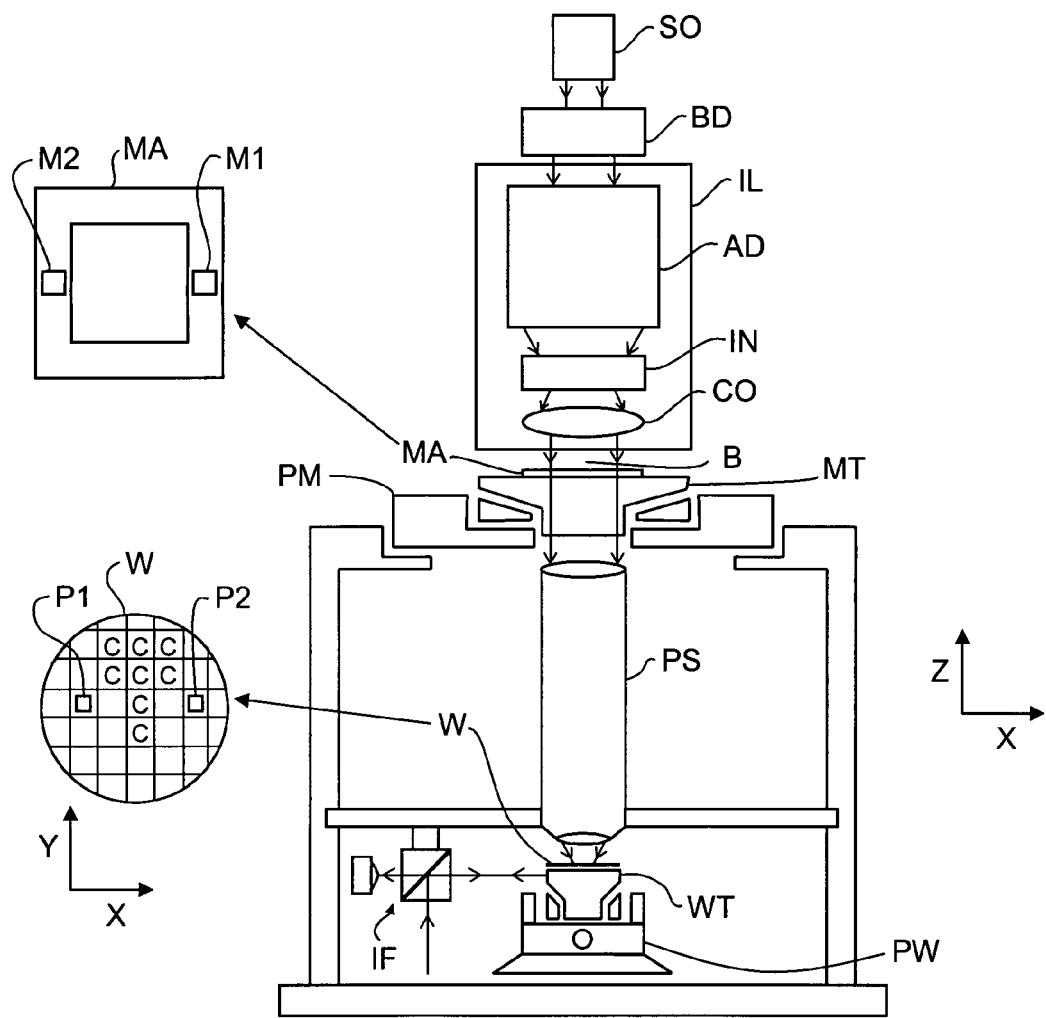
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure or patterning device support supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIGS. 2 and 3 show a side view and bottom view of a measurement system according to an embodiment of the present invention generally indicated with the reference numeral 1. The measurement system 1 is configured to measure the position of a substrate stage 2 supporting a substrate 2a with respect to a so-called metrology frame or metro-frame 3. The metro-frame 3 is a substantially stationary frame, to which the lens column 4 is mounted. In this respect it is remarked that a substantially stationary frame may be any frame which is passively or actively held in a substantially stationary position. The metro-frame 3 of the known lithographic apparatus is mounted with passive or active air-mounts on a base frame to filter any external disturbances such as vibrations in the factory floor. In this way the lens column is held in a substantially stationary position. During a scanning movement of the substrate stage, it is desired to know the position of the substrate stage with respect to the lens column. Therefore, a position measurement system 1 is provided with which the position of the substrate stage with respect to the metro-frame 3 can be determined.

The measurement system 1 includes one or more sensors 5 which are used to determine the change in position of the substrate stage with respect to a sensor target object including a grating or grid, such as a sensor target plate. The sensor target object is, in the embodiment shown in FIGS. 2 and 3, a grid plate 6 including a two-dimensional grid. The grid plate 6 includes a large number of grid lines or spots which are used for determining the position of the one or more sensors 5 with respect to the grid plate 6. The term grid plate as used in this application may refer to any type of sensor target object which is provided with a grid or grating as a part of a measurement system. Such measurement system is usually referred to as an encoder-type measurement system and is known in the art.

The grid plate 6 includes a central hole for the lens column 4 and is mounted on the metro-frame 3 with a mounting device 7 including three flexure elements 8. The flexure elements 8 are arranged in a substantially horizontal plane at equal angles on the circumference of an imaginary circle 9. The center of the imaginary circle 9 substantially corresponds with the central axis A-A of a lens column 4 of the lithographic apparatus. The metro-frame 3 may change in shape due to temperature or other external influences. In the known lithographic apparatus, this change in shape of the metro-frame is substantially symmetrical to the central axis of the lens column 4. The flexure elements 8 are arranged to allow the changes of the metro-frame 3 in radial directions with respect to the central axis of the lens column 4 without introducing a substantial shape change in the grid plate 6. A relative small change in the shape or position of the grid plate 6 may still occur. The direction of movement of the metro-frame sides of the flexure elements 8 is indicated with double-headed arrows in FIG. 3. Since the shape change of the metro-frame 2 is substantially symmetrical with respect to the central axis A-A of the lens column, the grid plate 6 will not be moved out of its position.

However, during the movement of the substrate stage 2 air is displaced in the working space of the substrate stage 2. As a result pressure, waves may propagate through the working space. These pressure waves may cause movements and/or deformations of the grid plate 6, in particular since the mounting device of the grid plate introduces some flexibility in the support of the grid plate. But even when a more stiff mounting of the grid plate 6 would be used the pressure waves may cause the grid plate 6 to move or deform.

In the embodiment of FIGS. 2 and 3, a damping device 10 is provided at three locations to compensate these movements or deformations. In this respect it is remarked that the term compensate means that the movements and/or deformations of the grid plate are to a substantial extent suppressed by the provision of the damping device or more generally by the compensation device of the invention. The damping device 10 is a passive damping device including a passive magnet 11 which causes a force which is directed in the opposite direction with respect to a displacement of an element 12 for instance of aluminum being provided on the grid plate 6.

In alternative embodiments, the passive damping device may be any device providing a damping effect for the movements or deformations of the grid plate 6.

In another embodiment, the damping device may be an active damping device including one or more sensors to measure the position of the grid plate 6 and one or more actuation devices to damp any displacements of the grid plate 6 with respect to the metro-frame 3.

It has been found that a passive or active damping device provides in particular efficient compensation of displacements, i.e. movements or deformations, of the grid plate 3 in the resonance frequencies of the grid plate 6, although the damping device may also provide an adequate damping in other frequency ranges.

In the embodiment of FIGS. 2 and 3, the damping device 10 is configured to damp displacements of the grid plate 6 in the vertical direction, i.e. the direction substantially perpendicular to the main plane of the grid plate. Similar provisions may be provided for displacements of the grid plate 6 in other directions, for instance for one or more horizontal directions, i.e. directions parallel to the main plane of the grid plate 6 or any other desired direction.

Furthermore, in the first embodiment, three damping devices 10 are provided which are arranged in a circle. The number of damping devices or more general compensation devices according to the invention and the location thereof can be any suitable arrangement to compensate the movements and/or deformations of the grid plate 6.

Figure 4:
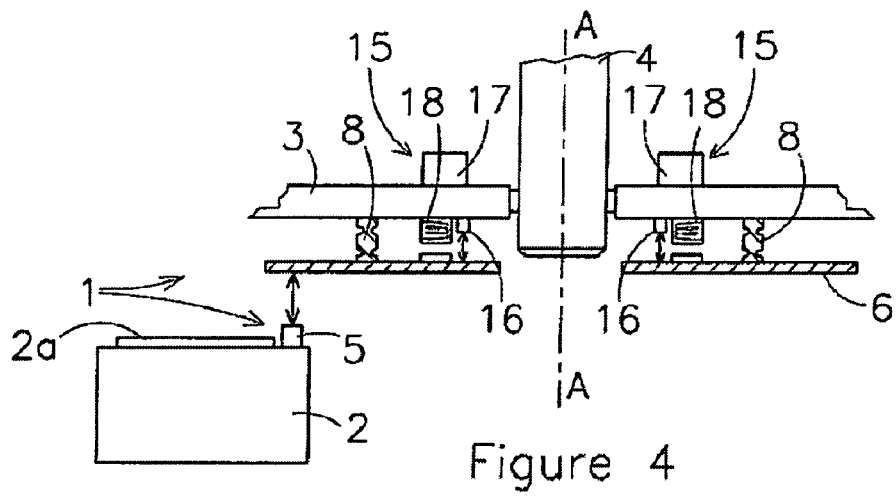
FIG. 4 depicts schematically a side view of a measurement system according to an embodiment of the invention.

FIG. 4 shows a measurement system according to an embodiment of the invention. In this embodiment, a feedback position control system 15 is provided to control the position of the grid plate 6 with respect to the metro-frame 3. The feedback position control system 15 includes one or more sensors 16, a controller 17 and one or more actuators 18. The feedback control system is provided to keep the grid plate 6 in substantially the same position with respect to the metro-frame 3. The position control system 15 may further be designed according to any control system known in the field.

The feedback position control system 15 is in the embodiment of FIG. 4 applied to suppress displacements of the grid plate 6 in the vertical direction which is in the drawing is the direction substantially perpendicular to the main plane of the grid plate 6. The position control system 15 may also be applied to suppress displacements in one or more other directions.

It has been found that the provision of a position control system is in particular useful for the suppression of movements or deformations in a low frequency range, i.e. a frequency range lower than the resonance frequency range. However, the provision of a feedback position control system may also be beneficial to suppress displacements of the grid plate 6 in other frequency ranges. In an embodiment, the position control system may be designed to provide both damping in the resonance frequency range as well as position control in the low frequency range.

Figure 5:
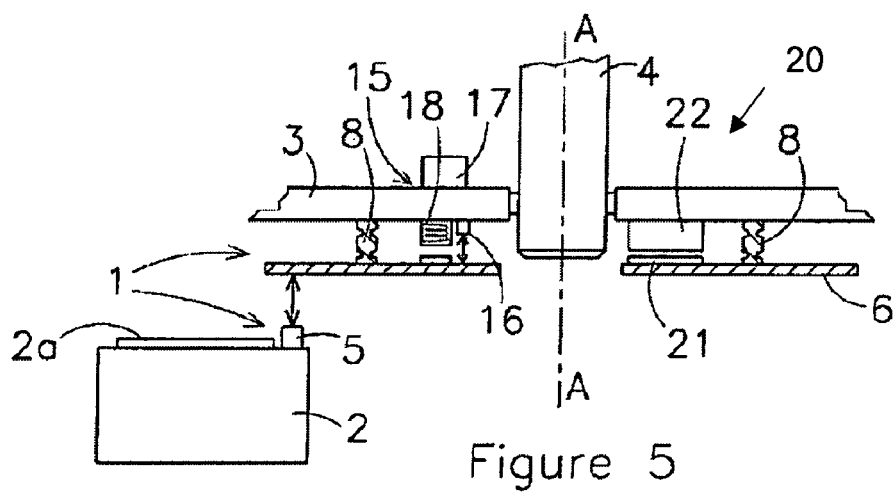
FIG. 5 depicts schematically a side view of a measurement system according to an embodiment of the invention.

FIG. 5 shows a measurement system according to an embodiment of the invention. In this embodiment a passive damping device 20 and a feedback position control system 15 of the embodiment of FIG. 4 are combined. Both the damping device 10 and the position control system 15 are provided to provide suppression of displacements of the grid plate 6 in the direction perpendicular to the main plane of the grid plate 6. The passive damping device 20 is in particular provided for suppression of displacement in the resonance frequency range, while the feedback position control system 15 is in particular designed for suppression of displacements in the lower frequency ranges.

The passive damping device 20 includes a first damping element 21 provided on the grid plate and a second damping element 22 mounted on the metro-frame 3. Between the two damping elements 21, 22 a small air gap is formed which functions as a frictionless damping device. The air gap may for instance be about 50-150 μm and preferably extends over a relatively large area, for instance about 200 cm$^2$.

Another type of damping device, such as the damping device 10 of the first embodiment or another damping device may also be provided. The damping may also be carried out by the position control system 15 as described in relation to the second embodiment.

Similar combination of damping devices and/or position control systems may be provided for damping/position control in one or more other directions.

Figure 6:
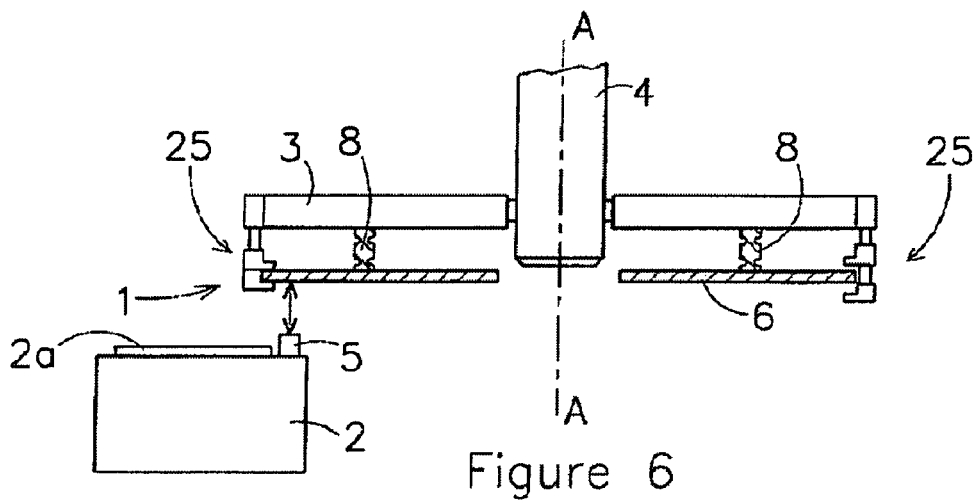
FIG. 6 depicts schematically a side view of a measurement system according to an embodiment of the invention.

FIG. 6 shows a measurement system according to an embodiment of the invention. In this embodiment, the measurement system includes a gripping device 25 which is mounted on the metro-frame and is movable between two positions, the holding position and the free position. In the holding position, shown at the left side of FIG. 6, the grid plate 6 is fixed in at least the direction substantially perpendicular to the main plane of the grid plate 6. In the free position, shown at the right side of FIG. 6, the gripping device does not hold the grid plate 6 and there is preferably no physical contact between the gripping device 25 and the grid plate 6.

As explained above, the flexure elements are 8 provided to compensate movements of the metro-frame with respect to the grid plate 6. For this reason, it is in general undesirable to provide a mounting device which fixes the grid plate 6 in six degrees of freedom since relative movements of the metro-frame 3 would be transferred to the grid plate 6. However, the movements of the metro-frame, in particular when caused by temperature changes or differences, are relative slow.

Furthermore, the high accuracy of the measurement system is in particular desired during scanning movements of the substrate stage, i.e. during scanning or exposure of a substrate. The gripping device 25 (or fixing device) according to the embodiment of FIG. 6 can be used to fix the grid plate 6 during the scanning movements of the substrate stage to substantially suppress movements or deformations of the grid plate due to external disturbances during these scanning movements. Before and after the scanning movement, the gripping devices 25 can be placed in the free position so that any shape changes of the metro-frame 3 can be compensated between two scanning movements. In this way, both the disturbances in the metro-frame 3 and external disturbances on the grid plate 3 for instance caused by pressure waves can be compensated, and thus the accuracy of the measurement system is increased.

The term gripping device as used in this application refers to any device capable of substantially fixing the grid plate 6 in at least one direction during a certain time period and releasing the grid plate 6 during another time period.

In the embodiment of FIG. 4, the gripping device 25 is used as a fixing device to fix the position of the grid plate 6 in at least the direction substantially perpendicular to the main plane of the grid plate. In other embodiments, the gripping device 25 may also be designed to fix the grid plate in more directions or other direction(s). In an embodiment, one or more gripping devices are provided which are configured to fix in the holding position the grid plate in six degrees of freedom.

In alternative embodiments of the invention the measurement system may include two or more grid plates which are arranged in substantially the same plane which take over the function of one large grid plate. Each of these grid plates may be provided with a compensation device as described in this application.

In other embodiments, the one or more sensors may be arranged on the substantially stationary frame while the grid plate or grid plates are arranged on the movable object. In such embodiments a compensation device may be provided for each grid plate to compensate for movements and/or deformations of the grid plate with respect to the movable object. Such movements/deformations may be caused by disturbances, such as pressure waves due to the movement of the movable object. Such other embodiments are deemed to fall within the scope of the present invention.

In the above description, the compensation of movements and/or deformations of the grid plate with respect to the metro-frame of a lithographic apparatus has been described. The compensation device may also be used for the compensation of movements or displacements of other system parts of measurement systems with respect to the frame on which the respective system part is mounted. Such embodiments fall within the scope of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An encoder-type measurement system configured to measure a position dependent signal of a movable object, the measurement system comprising:
   at least one sensor mountable on the movable object;
   a sensor target object including a grating or grid mountable on a substantially stationary frame;
   a flexible mounting device configured to mount the sensor target object on the substantially stationary frame; and
   a compensation device configured to at least partially compensate movements, deformations, or both, of the sensor target object with respect to the substantially stationary frame.

2. The measurement system of claim 1, wherein the compensation device comprises:
   a damping device configured to damp the movements, deformations, or both, of the sensor target object.

3. The measurement system of claim 2, wherein the damping device is a passive damping device.

4. The measurement system of claim 2, wherein the damping device is an active damping device.

5. The measurement system of claim 1, wherein the compensation device comprises a feedback position control system.

6. The measurement system of claim 1, wherein the compensation device comprises:
   a damping device configured to compensate substantially in a resonance frequency range of the sensor target object; and
   a position control system configured to compensate substantially in a frequency range lower than the resonance frequency range.

7. The measurement system of claim 1, wherein the compensation device comprises:
   a fixing device configured to fix the sensor target object during a high accuracy movement of the movable object in order to fix the sensor target object with respect to the substantially stationary frame in at least one degree of freedom.

8. The measurement system of claim 7, wherein the fixing device is capable of fixing the sensor target object in six degrees of freedom.

9. The measurement system of claim 1, wherein the mounting device comprises:
   a plurality of flexure elements, each configured to couple the sensor target object to the substantially stationary frame, at least one flexure element being flexible in at least one degree of freedom.

10. The measurement system of claim 1, wherein the sensor target object is a sensor target plate comprising a grating or grid.

11. The measurement system of claim 10, wherein the sensor target plate is a grating plate or grid plate.

12. The measurement system of claim 1, wherein the compensation device is configured to compensate vertical displacements of the sensor target object.

13. The measurement system of claim 1, wherein the compensation device is configured to compensate horizontal displacements of the sensor target object.

14. The measurement system of claim 1, wherein the movable object is a substrate stage or a reticle stage of a lithographic apparatus.

15. The measurement system of claim 1, wherein the position dependent signal is a position, speed, or acceleration signal of the movable object.

16. A method for measuring a position dependent signal of a movable object with respect to a substantially stationary frame using an encoder-type measurement system having a sensor mounted on the movable object and a sensor target object comprising a grating or grid mounted with a flexible mounting device on the substantially stationary frame, the method comprising:
   at least partially compensating movements, deformations, or both, of the sensor target object with respect to the substantially stationary frame.

17. The method of claim 16, wherein the compensating comprises:
   damping movements, deformations or both of the sensor target object.

18. The method of claim 16, wherein the compensating comprises:
   applying a feedback position control of the sensor target object.

19. The method of claim 17, wherein the compensating comprises:
   damping movements, deformations or both of the sensor target object substantially in a resonance frequency range of the sensor target object; and
   applying a feedback position control substantially in a frequency range lower than the resonance frequency range.

20. An encoder-type measurement system configured to measure a position dependent signal of a movable object, the measurement system comprising:
   at least one sensor mountable on a substantially stationary frame;
   a sensor target object including a grating or grid mountable on the moveable object;
   a flexible mounting device configured to mount the sensor target object on the moveable object; and
   a compensation device configured to at least partially compensate movements, deformations, or both, of the sensor target object with respect to the moveable object.

21. The measurement system of claim 20, wherein the compensation device comprises:
   a damping device configured to damp the movements, deformations, or both, of the sensor target object.

22. The measurement system of claim 21, wherein the damping device is a passive damping device.

23. The measurement system of claim 21, wherein the damping device is an active damping device.

24. The measurement system of claim 20, wherein the compensation device comprises a feedback position control system.

25. The measurement system of claim 20, wherein the compensation device comprises:
   a damping device configured to compensate substantially in a resonance frequency range of the sensor target object; and
   a position control system configured to compensate substantially in a frequency range lower than the resonance frequency range.

26. The measurement system of claim 20, wherein the compensation device comprises:
   a fixing device configured to fix the sensor target object during a high accuracy movement of the movable object in order to fix the sensor target object with respect to the substantially stationary frame in at least one degree of freedom.

27. The measurement system of claim 26, wherein the fixing device is capable of fixing the sensor target object in six degrees of freedom.

28. The measurement system of claim 20, wherein the mounting device comprises:
  a plurality of flexure elements configured to couple the sensor target object to the moveable object, at least one flexure element being flexible in at least one degree of freedom.

29. The measurement system of claim 20, wherein the sensor target object is a sensor target plate comprising a grating or grid.

30. The measurement system of claim 20, wherein the movable object is a substrate stage or a reticle stage of a lithographic apparatus.

31. The measurement system of claim 20, wherein the position dependent signal is a position, speed, or acceleration signal of the movable object.

32. A measurement system configured to measure a position dependent signal of a movable object with respect to a substantially stationary frame, the measurement system comprising:
  at least one sensor mountable on the substantially stationary frame;
  at least one system part separate from the substantially stationary frame;
  a flexible mounting device configured to mount the system part on the moveable object; and
  a compensation device configured to at least partially compensate movements, deformations, or both, of the system part with respect to the substantially stationary frame.

33. The measurement system of claim 32, wherein the measurement system is an encoder-type measurement system and the at least one system part includes a grid or grating.

* * * * *

UNITED STATES PATENT AND TRADEMARK OFFICE
CERTIFICATE OF CORRECTION

PATENT NO. : 7,903,866 B2
APPLICATION NO. : 11/730190
DATED : March 8, 2011
INVENTOR(S) : Van Der Wijst et al.

Page 1 of 1

It is certified that error appears in the above-identified patent and that said Letters Patent is hereby corrected as shown below:

In Claim 26, line 63 please delete "substantially stationary frame" and replace with --moveable object--.

In Claim 32, lines 10-11, please delete "substantially stationary frame" and replace with --moveable object--.

Signed and Sealed this
Third Day of May, 2011

David J. Kappos
*Director of the United States Patent and Trademark Office*